United States Patent
Shin et al.

(10) Patent No.: US 10,319,995 B2
(45) Date of Patent: Jun. 11, 2019

(54) SILICON NANOWIRE STRUCTURE EMBEDDED IN NICKEL SILICIDE NANOWIRES FOR LITHIUM-BASED BATTERY ANODES

(71) Applicants: Hyundai Motor Company, Seoul (KR); Research & Business Foundation Sungkyunkwan University, Suwon, Gyeonggi-Do (KR)

(72) Inventors: Kyo Min Shin, Gyeonggi-Do (KR); Sa Heum Kim, Gyeonggi-Do (KR); Hong Seok Min, Gyeonggi-Do (KR); Mihai Robert Zamfir, Gyeonggi-Do (KR); Je Mee Joe, Gyeonngi-Do (KR); Didier Pribat, Seoul (KR); Yeo Jin Lee, Busan (KR)

(73) Assignees: Hyundai Motor Company, Seoul (KR); Research & Business Foundation Sungkyunkwan University, Suwon, Gyeonggi-do (KR)

( * ) Notice: Subject to any disclaimer, the term of this patent is extended or adjusted under 35 U.S.C. 154(b) by 45 days.

(21) Appl. No.: 14/543,626

(22) Filed: Nov. 17, 2014

(65) Prior Publication Data

US 2015/0200391 A1 Jul. 16, 2015

(51) Int. Cl.
*C23C 16/24* (2006.01)
*H01M 4/04* (2006.01)
(Continued)

(52) U.S. Cl.
CPC .............. *H01M 4/366* (2013.01); *C23C 16/24* (2013.01); *H01M 4/0428* (2013.01);
(Continued)

(58) Field of Classification Search
CPC ...... H01M 4/366; H01M 4/661; H01M 4/669; H01M 10/052; H01M 220/20; C23C 16/24
See application file for complete search history.

(56) References Cited

U.S. PATENT DOCUMENTS

| | | | |
|---|---|---|---|
| 2010/0202952 A1 | 8/2010 | Zhang et al. | |
| 2011/0026816 A1 | 2/2011 | Vaughn | |
| 2011/0159365 A1* | 6/2011 | Loveness | H01M 4/0428 429/218.1 |

FOREIGN PATENT DOCUMENTS

| CN | 102844917 A | 12/2012 |
|---|---|---|
| JP | 2013-084601 A | 5/2013 |

(Continued)

OTHER PUBLICATIONS

Xu, Wanli, "Silicon nanowire anode for lithium-ion batteries: fabrication, characterization and solid electrolyte interphase" (2011). LSU Doctoral Dissertations. 219. http://digitalcommons.lsu.edu/gradschool_dissertations/219. (Year: 2011).*

(Continued)

*Primary Examiner* — Sarah A. Slifka
*Assistant Examiner* — Brian R Ohara
(74) *Attorney, Agent, or Firm* — Mintz Levin Cohn Ferris Glovsky and Popeo, P.C.; Peter F. Corless

(57) ABSTRACT

The present invention provides a silicon nanowire structure embedded in nickel silicide nanowires for lithium-based battery anodes and anodes including the same. In particular, a Si nanowire structure embedded in $NiSi_x$ nanowires according to the present invention may provide a solution to a problem, such as disconnection of Si nanowires from a current collector shown when the Si nanowires are expanded by alloying with Li or contracted during the use of a battery, and the like, by flexibly embedding the Si nanowires in the $NiSi_x$ nanowires.

5 Claims, 6 Drawing Sheets

(51) Int. Cl.

| | | |
|---|---|---|
| *H01M 4/134* | (2010.01) | |
| *H01M 4/1395* | (2010.01) | |
| *H01M 4/38* | (2006.01) | |
| *H01M 4/66* | (2006.01) | |
| *H01M 10/052* | (2010.01) | |
| *H01M 4/02* | (2006.01) | |
| *H01M 4/36* | (2006.01) | |

(52) U.S. Cl.
CPC ......... *H01M 4/134* (2013.01); *H01M 4/1395* (2013.01); *H01M 4/386* (2013.01); *H01M 4/661* (2013.01); *H01M 4/669* (2013.01); *H01M 10/052* (2013.01); *H01M 2004/027* (2013.01); *H01M 2220/20* (2013.01); *Y02E 60/122* (2013.01)

(56) References Cited

FOREIGN PATENT DOCUMENTS

| | | | | |
|---|---|---|---|---|
| KR | 10-0883531 B1 | 2/2009 | | |
| KR | 10-0884360 | 2/2009 | | |
| KR | 10-2012-0024713 A | 3/2012 | | |
| KR | 10-2013-0033251 A | 4/2013 | | |
| KR | 20130033251 A * | 4/2013 | ........ | H01M 10/0431 |
| WO | 2011/109477 A2 | 9/2011 | | |
| WO | WO 2012027360 A2 * | 3/2012 | ............. | H01M 4/13 |

OTHER PUBLICATIONS

Translation of KR20130033251 (Year: 2018).*
Chun-Yi Liu et al., "An Ordered Si Nanowire with NiSi2 tip arrays as excellent field emitters", IOP Science—Nanotechnology, vol. 2, No. 5 (2010).
I.N. Lund et al., "Influence of catalyst layer thickness on the growth of nickel silicide nanowires and its application for Li-ion batteries", Journal of Power Sources, vol. 246, pp. 117-123 (2014).
W.R. Chen et al., "Reliability characteristcis of NiSi nanocrystals embedded in oxide and nitride layers for nonvolatile memory application", Applied Physics Letters, vol. 92, pp. 1-3 (2008).
Zamfir, Mihai Robert et al., "Silicon nanowires for Li-based battery anodes: a review" J. Mater. Chem. A, 2013, 1, 9566-9586.
J.M. Blakely et al., "Segregation of Carbon to the (100) Surface of Nickel", Journal of Applied Physics, 41(6), pp. 2693-2697 (1970).
C. Du et al., "CVD growth of carbon nanotubes directly on nickel substrate", Materials Letters, 59, pp. 1678-1682 (2005).
P.C. Yang et al., "Nucleation of oriented diamond films on nickel substrates", J. Mater. Res., 8(8), pp. 1773-1776 (1993).
S.J. Chae et al., "Synthesis of Large-Area Graphene Layers on Poly-Nickel Substrate by Chemical Vapor Deposition: Wrinkle Formation", Advanced Materials, 21, pp. 2328-2333 (2009).
Decker, C.A. et al., "Directed Growth of Nickel Silicide Nanowires", Applied Physics Letters, vol. 84, No. 8 (Feb. 23, 2004) pp. 1389-1391.

* cited by examiner

US 10,319,995 B2

SILICON NANOWIRE STRUCTURE EMBEDDED IN NICKEL SILICIDE NANOWIRES FOR LITHIUM-BASED BATTERY ANODES

CROSS-REFERENCE TO RELATED APPLICATION

This application claims under 35 U.S.C. § 119(a) the benefit of Korean Patent Application No. 10-2013-0165867 filed on Dec. 27, 2013, the entire contents of which are incorporated herein by reference.

TECHNICAL FIELD

The present invention relates to a silicon (Si) nanowire structure embedded in nickel silicide ($NiSi_x$) nanowires for lithium (Li)-based battery anodes. In particular, the present invention provides a Si nanowire structure embedded in $NiSi_x$ nanowires and anodes including the Si nanowires. Therefore, technical difficulties, such as disconnection of Si nanowires from a current collector shown when the Si nanowires are expanded by alloying with Li or contracted during the use of a battery, and the like, may be solved by flexibly embedding the Si nanowires in the $NiSi_x$ nanowires, and to anodes including the Si nanowires.

BACKGROUND

A battery having high performance and large capacity battery has been in increasing need for the use as a power source for a portable electronic device, an electric vehicle, and the like.

The battery generates electric power by using materials capable of electrochemical reactions in the positive electrode (cathode) and negative electrode (anode). Representative examples of the high performance battery may include a lithium secondary battery which generates electrical energy based on a change in chemical potential when lithium ions are intercalated or deintercalated in the cathode and anode.

The lithium secondary battery may provide high energy density by using organic electrolytic solutions and have a discharge voltage two or greater than that of a battery in which the mere alkaline aqueous solution is used. The lithium secondary battery may be manufactured by using materials capable of converting reversible intercalation/deintercalation of lithium ions as cathode and anode active materials, and filling an organic electrolyte solution or polymer electrolyte solution between the cathode and the anode.

Although research and development on the batteries have been continued for about 20 years, the lithium secondary battery may have a limitation in energy capacity since a combination of oxide or a phosphate material in the cathode and graphite in the anode have been used.

Therefore, in order to apply the lithium secondary battery, particularly, to an application for an electric vehicle, an electrode material having high Li storage capability may be required for both cathode and anode. Silicon (Si) may have the highest Li-alloying capability, for instance, of about 3,800 mAh/g, which is about ten times greater than Li-alloying capability of graphite. Accordingly, Si may be the most suitable anode material. However, a large volume change may occur in Si which is a host material when Li is alloyed with Si, and may cause cracking and rapid pulverization of a Si-based anode. In this regard, significant enhancement in the service life and charge-discharge rate of the anode has been obtained over several decades by introducing a Si nanostructure, particularly, nanowires. Due to a high surface-to-volume ratio of the Si nanostructure, the nanostructure may be more resistant to stress caused by the surface effect thereof than other structures, and may be strong against cracking.

In related arts, methods of synthesizing Si nanowires for an application for Li-based battery anodes have been provided; for example, a growth method and an etching method.

An example of the growth method which may be performed in a chemical vapor deposition (CVD) reactor may be a very-large-scale technology. Meanwhile, the etching method may obtain Si nanowires by performing etching from bulk crystalline Si, for example, Si wafer and Si powder.

In the growth method, Si nanowires may be grown directly on a current collector of an anode. When etched Si nanowires are used, the Si nanowires may be included in a binder, for instance, polymer binder, which may contain slurry and a conductive additive, such as carbon-based powder. The slurry may be generally deposited on the current collector of a battery electrode by a tape casting and dried in an oven prior to use, thereby removing a solvent from the slurry.

However, some technical problems during growth of Si nanowires have been reported in the related art.

For example, an active material may be diluted by using a binder and a conductive powder, indicating only a part of a given anode mass may contribute to Li storage. Similar problem may also occur in a graphite-based anode. In comparison to the theoretical capacity of graphite of about 372 mAh/g, the commercial anode manufactured by the slurry process may provide only up to 275 to 300 mAh/g.

In addition, when Si nanowire is expanded by alloying with Li, the Si nanowires may "push back" a surrounding binder and conductive particles. In particular, when the Si nanowires are contracted and Li as an electrolyte is released during the use of a battery, the surrounding binder and particles may dislocate from the original positions. Accordingly, some nanowires may be disconnected from a current collector, thereby causing a capacity loss of the electrode.

Furthermore, the thickness, or a charge capacity per $cm^2$ of the anode, of an anode material on the current collector may be limited by delamination that rapidly occurs when the thickness is in a range of several tens of microns.

In the related arts, a method of manufacturing nickel silicide which includes: (a) forming a ruthenium layer on a substrate; (b) forming a nickel layer on the ruthenium layer by CVD; and (c) forming nickel silicide by subjecting the ruthenium layer and the nickel layer to heat treatment at 300 to 1,100° C. for 40 seconds has been provided.

In addition, a technology of manufacturing nickel silicide of nonvolatile nanocrystal (NC) embedded in oxide and nitride layers by removing oxides and microparticles on a p-type silicon wafer by an RCA method, growing a 3-nm tunnel oxide in an atmospheric CVD system by a dry oxidation process to deposit an $Ni_{0.3}Si_{0.7}$ layer, and performing annealing under a nitrogen atmosphere by a rapid thermal annealing (RTA) process has been introduced. In another example, a technology of manufacturing pure NiSi nanowires including a polycrystalline $NiSi_2$ core having a thickness of about 30 nm, SiO shell nanowires doped with amorphous Ni, and nickel on a Ni catalyst layer deposited in a thickness of about 2 nm on a stainless steel substrate by a CVD furnace using silane has been developed. In addition, a technology of manufacturing an ordered Si nanowire with NiSi$_2$ tip arrays by reacting a nickel thin film on an ordered silicon nanowire array coated with silica has been provided.

However, above-described technologies in the related arts still do not provide further solution, such as deterioration of physical properties or structural defects caused by the capacity loss or thickness limitation.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention may provide a technical solution to above-described problems with the related art. For example, when Si nanowires etched on a current collector are loaded into a CVD reactor, and NiSi nanowires are grown by a CVD process to flexibly embed the Si nanowires in the NiSi nanowires, the manufactured Si nanowire structure may reduce defects which may occurs when Si nanowires are expanded by alloying with Li or contracted during the use of a battery, and the like.

Accordingly, the present invention may provide the silicon (Si) nanowire structure embedded in nickel silicide (NiSi$_x$) nanowires which may be applied as lithium (Li)-based battery anodes. In addition, a silicon nanowire structure in which Si nanowires etched on a current collector are fixed, and a method of manufacturing the silicon nanowire structure are provided.

The present invention further provides an anode including a silicon nanowire structure embedded in nickel silicide nanowires used for lithium-based battery anodes.

In one aspect, the present invention provides a Si nanowire structure embedded in NiSi$_x$ nanowires, which may include: Si nanowires provided on a nickel (Ni) thin film deposited on a substrate; and NiSi$_x$ nanowires which may embed the Si nanowires on the Ni thin film.

In another aspect, the present invention provides a method of manufacturing a Si nanowire structure embedded in NiSi$_x$ nanowires. The method may include: depositing and coating a Ni thin film on a substrate; obtaining Si nanowires by an etching process; dispersing the Si nanowires in a suspension solution; providing the suspension solution including the Si nanowires on the substrate coated with the Ni thin film; loading the Si nanowires and the substrate coated with the Ni thin film into a chemical vapor deposit (CVD) reactor; and growing NiSi$_x$ nanowires by introducing hydrogen gas (H$_2$) and silane gas (SiH$_4$) into the CVD reactor to perform a CVD process.

The Si nanowire structure embedded in NiSi$_x$ nanowires according to an exemplary embodiment of the present invention may prevent the defects shown when Si nanowires are expanded by alloying with Li or contracted during the use of a battery. In particular, the Si nanowire structure may prevent disconnection of Si nanowires from a current collector shown when the Si nanowires are expanded by alloying with Li or contracted during the use of a battery, due to improved performance of the Si nanowire structure. For example, about 75% of the original capacity may be maintained even after about 250 times of charging-discharging cycles. Furthermore, NiSi$_x$ nanowires according to an exemplary embodiment of the present invention may flexibly embed Si nanowires. Accordingly, the Si nanowire structure of the present invention may be applied to lithium secondary battery anodes.

Other aspects and exemplary embodiments of the invention are discussed infra.

BRIEF DESCRIPTION OF THE DRAWINGS

The above and other features of the present invention will now be described in detail with reference to exemplary embodiments thereof illustrated the accompanying drawings which are given hereinbelow by way of illustration only, and thus are not limitative of the present invention, and wherein.

Figure 1A:
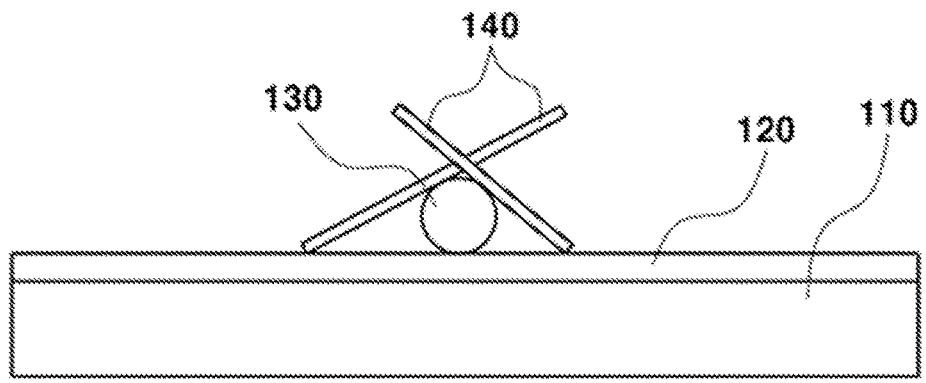
FIG. 1A schematically illustrates an exemplary Si nanowire structure embedded in NiSi$_x$ nanowires before lithiation occurs according to an exemplary embodiment of the present invention, and FIG. 1B schematically illustrates an exemplary modified Si nanowires structure after lithiation occurs.

Reference numerals set forth in the Drawings includes reference to the following elements as further discussed below:

| 110: substrate | 120: Ni thin film |
|---|---|
| 130: Si nanowire | 140: NiSi$_x$ nanowire |

It should be understood that the appended drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about".

Hereinafter reference will now be made in detail to various exemplary embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, an exemplary embodiment of the present invention will be described in more detail as follows.

The present invention relates to a Si nanowire structure deposited on a Ni thin film and embedded in $NiSi_x$ nanowires, and provides an anode structure which may fix Si nanowires etched on a current collector, and a method of manufacturing the Si nanowire structure.

The Si nanowire structure embedded in $NiSi_x$ nanowires according to an exemplary embodiment of the present invention may be formed on a substrate. In particular, the substrate may be, but not limited to, a Cu substrate or a steel-use-stainless (SUS) substrate. In an exemplary embodiment, the substrate may be a current collector of an anode, without limitation. In an exemplary embodiment, a Ni thin film may be coated on the substrate by deposition. In particular, the thickness of the Ni thin film may be, but not limited to, in a range from about 200 to about 500 nm. In another exemplary embodiment, a Ni foam may also be used instead of the Ni thin film. In addition, the Si nanowires may be obtained by an etching process.

In an exemplary embodiment, the Si nanowire structure embedded in $NiSi_x$ nanowires may be formed on the substrate. Particularly, the embedded structure may be obtained by loading the Si nanowires into a CVD reactor after a desired amount of the Si nanowires are provided on a substrate coated with a Ni thin film, and growing the $NiSi_x$ nanowires by performing a CVD process while introducing $H_2$ and $SiH_4$ therein.

In an exemplary embodiment, the method of manufacturing the Si nanowire structure embedded in $NiSi_x$ nanowires may include: preparing a substrate; depositing a Ni thin film on the substrate; obtaining Si nanowires by an etching process; dispersing the Si nanowires in a suspension solution; providing the suspension solution including the Si nanowires on the substrate coated with the Ni thin film; loading the Si nanowires and the substrate coated with the Ni thin film into a CVD reactor after a desired amount of the Si nanowires are provided on the substrate coated with the Ni thin film; and growing the $NiSi_x$ nanowires while introducing $H_2$ and $SiH_4$ into the CVD reactor to perform a CVD process.

According to an exemplary embodiment of the present invention, the Si nanowires may be obtained by an individual etching of a crystalline Si wafer or a crystalline Si powder, without limitation. In particular, the Si nanowires may be obtained from the crystalline Si wafer or the crystalline Si powder, without limitation, by a metal-assisted chemical etching.

Subsequently, the obtained Si nanowires may be dispersed in a suspension solution. In particular, the suspension solution may be an alcohol-based solution. The alcohol-based suspension solution may include, without limitation, ethyl alcohol, or alcohol-based component such as 99.9% ethyl alcohol. In addition, the suspension solution including Si nanowires may be prepared by dispersing the Si nanowires in the suspension solution at room temperature.

Further, in an exemplary embodiment of the present invention, the Si nanowires in the suspension solution may be provided on the substrate coated with the Ni thin film, without limitation, by a dropping method. In addition, the process of providing the solution including the Si nanowires on the substrate coated with the Ni thin film may continue until the desired amount of the Si nanowires is provided on the substrate coated with the Ni thin film.

The Si nanowires may be loaded into a chemical vapor deposit (CVD) reactor after the desired amount of the Si nanowires are provided on the substrate coated with the Ni thin film. When the desired amount of Si nanowires required for a current collector substrate are provided, Si nanowires and substrate coated with Ni thin film may be loaded into the CVD reactor for growth of $NiSi_x$ nanowires. In an exemplary embodiment, the $NiSi_x$ nanowires may be grown by introducing $H_2$ and $SiH_4$ into the CVD reactor to perform a CVD process. In particular, at a pressure in a range from about 40 to about 60 mTorr, $H_2$ and $SiH_4$ may be introduced into the CVD reactor at a rate in a range from about 350 to about 450 sccm and a rate in a range from about 0.5 to about 1.5 sccm, respectively. In addition, the process of growing $NiSi_x$ in the CVD reactor may be performed at a temperature in a range from about 300° C. to about 500° C. and a pressure in a range from about $10^{-5}$ Torr to about $10^{-7}$ Torr.

The $NiSi_x$ nanowires in which the Si nanowires are embedded may connect the Si nanowires on a current collector, and may readily withstand a change in volume of the Si nanowires, particularly, during alloying and de-alloying with Li as an elastic binder.

In an exemplary embodiment of the present invention, an anode for a lithium secondary battery may be manufactured by using the Si nanowire structure embedded in $NiSi_x$ nanowires which may be manufactured according an exemplary embodiment as described above. The anode including the Si nanowire structure embedded in $NiSi_x$ nanowires according an exemplary embodiment of the present invention may include: a substrate; a Ni thin film deposited on the substrate; Si nanowires deposited on the Ni thin film; and $NiSi_x$ nanowires embedding the Si nanowires while being deposited on the Ni thin film.

Figure 1B:
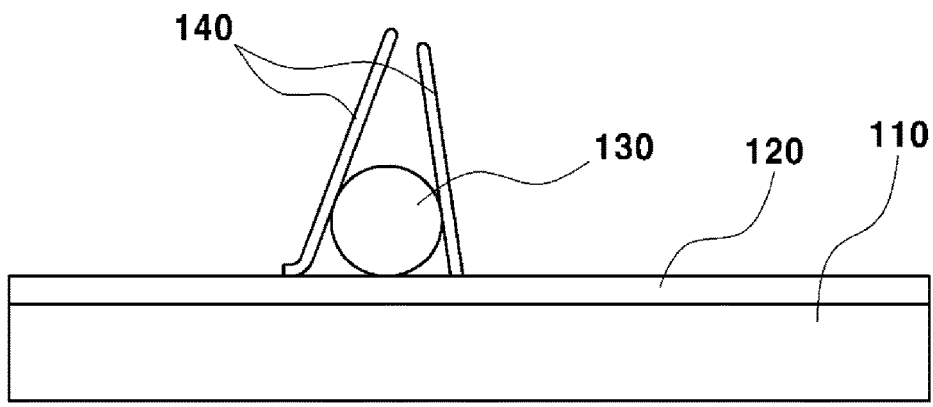

In FIGS. 1A-1B, the Si nanowire structures embedded in $NiSi_x$ nanowires according to an exemplary embodiment of the present invention are illustrated. Before the lithiation occurs as shown in FIG. 1A, a Si nanowire 130 on a Ni thin film 120 on a substrate 110 may be embedded in a $SiNi_x$ nanowire 140. After the lithiation occurs as shown in FIG. 1B, the elastic $NiSi_x$ nanowires may keep supporting Si nanowires, thereby providing both electrical contact and adhesion properties on a current collector. FIGS. 1A-1B illustrate modified forms of the Si nanowire structures embedded in $NiSi_x$ nanowires, without limitation, according to various exemplary embodiments of the present invention.

FIG. 1A illustrates an exemplary Si nanowire structure embedded in $NiSi_x$ nanowires before the lithiation occurs. FIG. 1B illustrates an exemplary modified form of FIG. 1A after the lithiation occurs. Since the elastic $SiNi_x$ nanowires keep supporting the Si nanowires while maintaining the state of being embedded even after the lithiation, both electrical contact and adhesion properties may be provided on a current collector.

FIGS. 1A-1B further illustrate cross-sectional forms of a shape in which the Ni thin film 120 is formed by depositing a Ni film on the substrate 110, and the $NiSi_x$ nanowire 140 grown under the flow of $SiH_4$ while being embedded with the Si nanowire 130 is randomly arranged. In detail, an orientation in which the $NiSi_x$ nanowire 140 is grown and arranged on the substrate 110 is illustrated, and the $NiSi_x$ nanowire 140 is grown from the Ni thin film 120 deposited on the substrate. According to an exemplary embodiment, the $NiSi_x$ nanowire 140 may be grown under the flow of $SiH_4$ in the CVD reactor. The $NiSi_x$ nanowire 140 may be grown at a random angle with respect to the plane of the substrate 110, or the $NiSi_x$ nanowire 140 may not be vertical to the plane. In this respect, the $NiSi_x$ nanowire 140 may be grown on the Si nanowire 130 already disposed on the Ni thin film 120. Accordingly, as illustrated in FIGS. 1A-1B, the $NiSi_x$ nanowire 140 may be embedded with the Si nanowire 130.

Figure 2A:
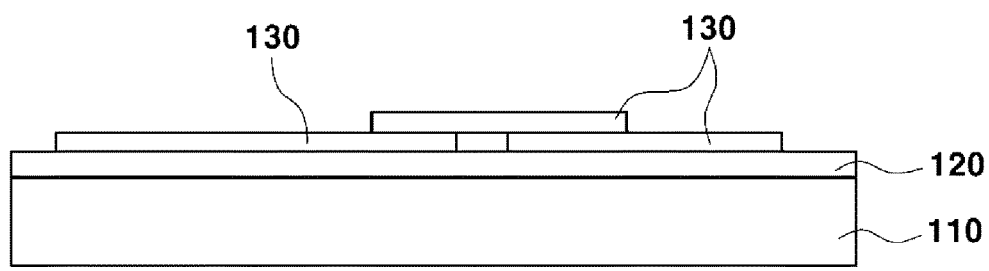
FIG. 2A is a cross-sectional structural view which schematically illustrates exemplary Si nanowires on the substrate coated with Ni before embedded by NiSi$_x$ nanowires according to an exemplary embodiment of the present invention.
Figure 2B:
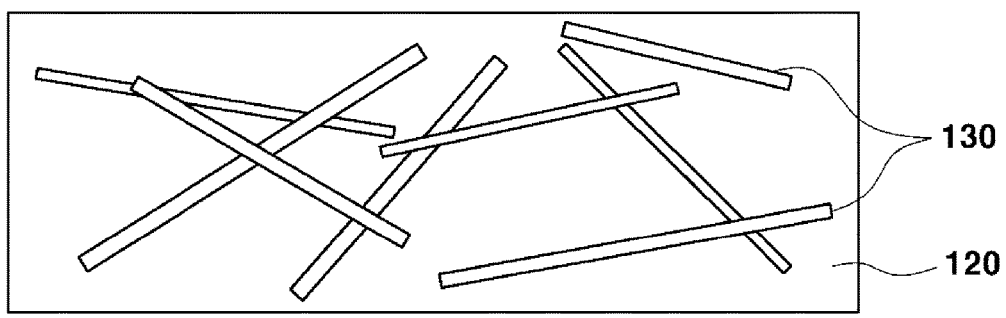
FIG. 2B are a plan view which schematically illustrates exemplary Si nanowires on the substrate coated with Ni by NiSi$_x$ nanowires before CVD according to an exemplary embodiment of the present invention.

FIGS. 2A-2B are a cross-sectional structural view and a plan view, respectively, which schematically illustrate exemplary orientations of Si nanowires before being embedded on the substrate coated with Ni by $NiSi_x$ nanowires. In FIGS. 2A-2B, an exemplary Si nanowire structure as in FIGS. 1A-1B may be formed when the Si nanowire 110 is formed on a substrate coated with Ni, and $NiSi_x$ nanowires are grown thereon.

Figure 3:
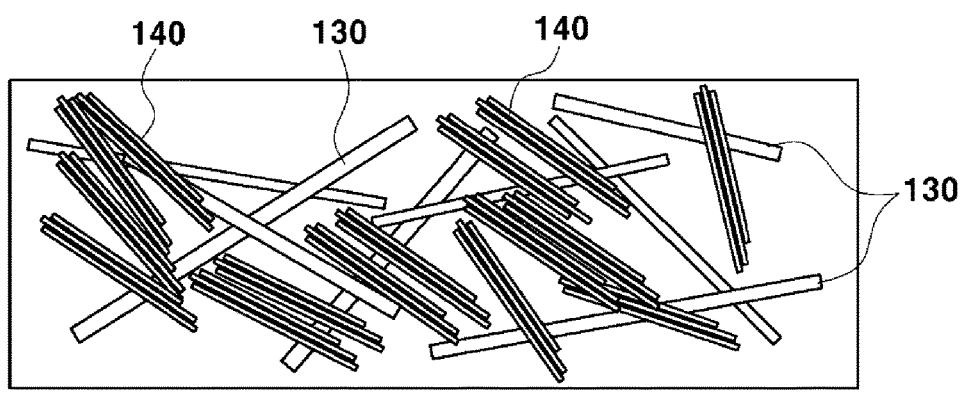
FIG. 3 is a plan view which schematically illustrates an exemplary Si nanowire structure embedded in NiSi$_x$ nanowires according to an exemplary embodiment of the present invention.

FIG. 3 is a cross-sectional schematic view and a plan view, respectively, which schematically illustrate an exemplary Si nanowire structure, in which the $NiSi_x$ nanowire 140 is embedded with the Si nanowire 130 on the substrate 110 according to an exemplary embodiment of the present invention. FIG. 3 further illustrates exemplary NiSix nanowires 140 which may be randomly grown after Si nanowires 130 are deposited on the substrate coated with Ni. Since the $NiSi_x$ nanowire 140 is long and flexible, the $NiSi_x$ nanowire 140 may provide a kind of elastic contact with respect to the Si nanowire 130, and have a structure which may withstand the volume expansion of the Si nanowire when alloyed with Li during the operation of a lithium secondary battery.

As described above, the Si nanowire structure according to various exemplary embodiments of the present invention may provide a solution to the problem, such as disconnection of Si nanowires from a current collector shown when the Si nanowires are expanded by alloying with Li or contracted during the use of a battery, and the like, since the Si nanowires may exhibit improved performance of maintaining about 75% of the original capacity even after 250 times of charging-discharging cycles, and further, $NiSi_x$ nanowires may be flexibly embedded with Si nanowires.

Hereinafter, the present invention will be described in detail with reference to an Example, and the present invention is not limited thereto.

The present Example is not a comprehensive overview of all the possible Examples, and is not even intended to identify the core element among all the elements or cover the scope of all the Examples. The present Example is for providing a concept by using an Example in a simplified form as an exemplary embodiment for the detailed description.

EXAMPLES

The following examples illustrate the invention and are not intended to limit the same.

Figure 4:
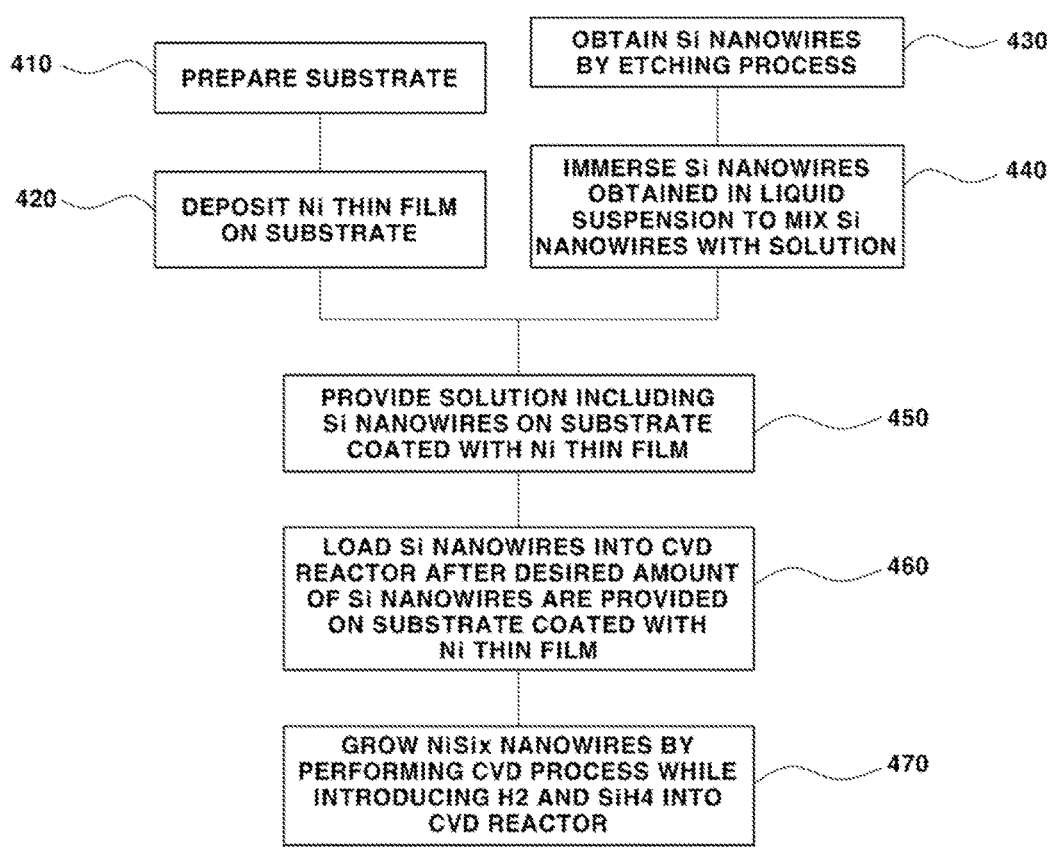
FIG. 4 is a diagram illustrating exemplary processes of a method for manufacturing a Si nanowire structure embedded in NiSi$_x$ nanowires according to an exemplary embodiment of the present invention.

A Si nanowire structure embedded in $NiSi_x$ nanowires may be manufactured by a process illustrated in FIG. 4.

In an exemplary embodiment, the method of manufacturing may include: preparing a substrate in step 410; depositing a Ni thin film on the substrate in step 420; obtaining Si nanowires by an etching process in step 430; dispersing the Si nanowires in a suspension solution in step 440; providing the suspension solution including the Si nanowires on the substrate coated with the Ni thin film in step 450; loading the Si nanowires and the substrate coated with the Ni thin film into a CVD reactor after a desired amount of Si nanowires are provided on the substrate coated with the Ni thin film in step 460; and growing the $NiSi_x$ nanowires by performing a CVD process while introducing $H_2$ and $SiH_4$ into the CVD reactor in step 470.

A substrate may be prepared in step 410. The substrate may be a current collector of an anode by using an SUS substrate. The Ni thin film may be deposited on the substrate in step 420. In particular, the thickness of the Ni thin film may be about 200 nm. In step 430, the Si nanowires may be obtained by the etching process. In particular, the Si nanowires may be obtained individually by using a metal-assisted chemical etching on a crystalline Si wafer.

In step 440, the Si nanowires obtained after the etching may be dispersed in the suspension solution. As of the suspension solution, an alcohol-based suspension may be used. When the Si nanowires are dispersed in an alcohol-based liquid suspension solution, for instance, 99% ethyl alcohol, the wires may be mixed in the solution. When the suspension solution including the Si nanowires may be dropped on the substrate in the subsequent step, the wires may remain on the substrate and be randomly distributed on the substrate as the solution is evaporated.

In step 450, the suspension solution including Si nanowires may be provided by, but not limited to, a dropping method. A dropper may be used to perform the dropping method. The Si nanowires provided on the substrate may be randomly disposed. When the Si nanowires are dispersed in the suspension solution, and then the suspension solution including the Si nanowires is dropped on the substrate by dropping, Si nanowires may be randomly distributed on the substrate, and the solution is evaporated.

In step 460, when a desired amount of the Si nanowires are provided on the substrate coated with the Ni thin film, and the Si nanowires and the substrate coated with the Ni thin film may be loaded into the CVD reactor. A typical type of CVD reactor may be used without limitation.

In step 470, the $NiSi_x$ may grow into the CVD reactor, at a pressure of about 50 mTorr, and, $H_2$ and $SiH_4$ may be introduced at a rate of about 400 sccm and about 1 sccm, respectively, into the CVD reactor. In particular, the growing of the $NiSi_x$ nanowires by performing the CVD process may be performed at a temperature of about 400° C. and a pressure of about $10^{-6}$ Torr. The $NiSi_x$ nanowires may be randomly grown by using the CVD process, and be embedded with the Si nanowires. After the CVD process is completed and the temperature drops to less than about 50° C., the sample may be unloaded from the CVD reactor, and used as an anode for a lithium secondary battery.

In another exemplary embodiment, instead of using slurry in the process, nickel silicide ($NiSi_x$) may be grown after the deposition of Si nanowires etched on a current collector coated with Ni. The $NiSi_x$ nanowires grown after the Si nanowires are provided may be formed and embedded with the Si nanowires, thereby attaching the Si nanowires on the current collector. Thus, the $NiSi_x$ nanowires may provide a structure to serve as an elastic binder.

TEST EXAMPLES

For an anode including a Si nanowire structure in which the $NiSi_x$ nanowires are embedded according to the Example, a performance of an exemplary lithium secondary battery in which the anode is applied is evaluated. For the evaluation, a half-cell arrangement may be used for various electrochemical tests, and an anode electrode on one side and pure metallic Li as an opposite electrode may be used. For the above-prepared half-cell, a capacity test and a safety test may be prepared in a glove box filled with an Ar gas while keeping the humidity and oxygen contents less than about 1.0 ppm. The cell may be manufactured by using two cylindrical stainless steel electrodes having a diameter of about 14 mm and PTFE Swagelok parts.

For an electrolyte of a lithium secondary battery, a solution of about 1.15 M lithium hexafluorophosphate ($LiPF_6$) in a mixture of ethylene carbonate (EC) and diethyl carbonate (DEC) at a ratio of 3:7 (vol %), respectively, may be used as the electrolyte.

The electrochemical property of the electrode may be measured by varying charging-discharging rates by a battery tester system (BioLogic VSP). The galvanostatic cycling for evaluation of the service life as shown in FIG. 5 may be measured at a voltage window from 2.0 to 0 V for Li/Li+.

Figure 5:
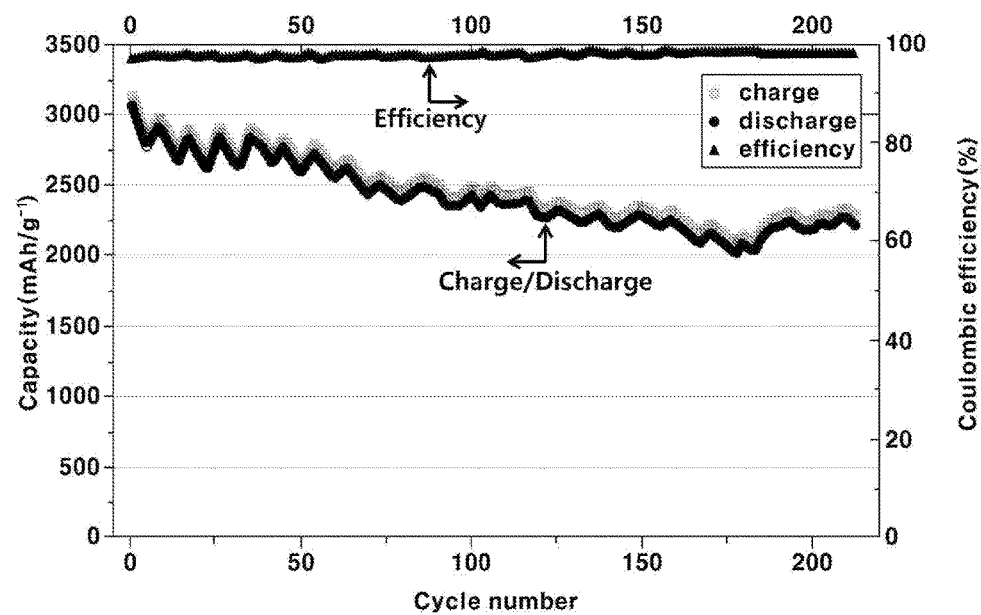
FIG. 5 is a graph illustrating a general ageing curve for exemplary anodes including the Si nanowire structure embedded in NiSi$_x$ nanowires manufactured by the method according to an exemplary embodiment of the present invention.

As a result, the ageing curve is provided in FIG. 5. Therefore, the Si nanowires according to an exemplary embodiment of the Example may maintain about 75% of the original capacity even after about 250 times of the charging-discharging cycles.

COMPARATIVE EXAMPLES

Figure 6:
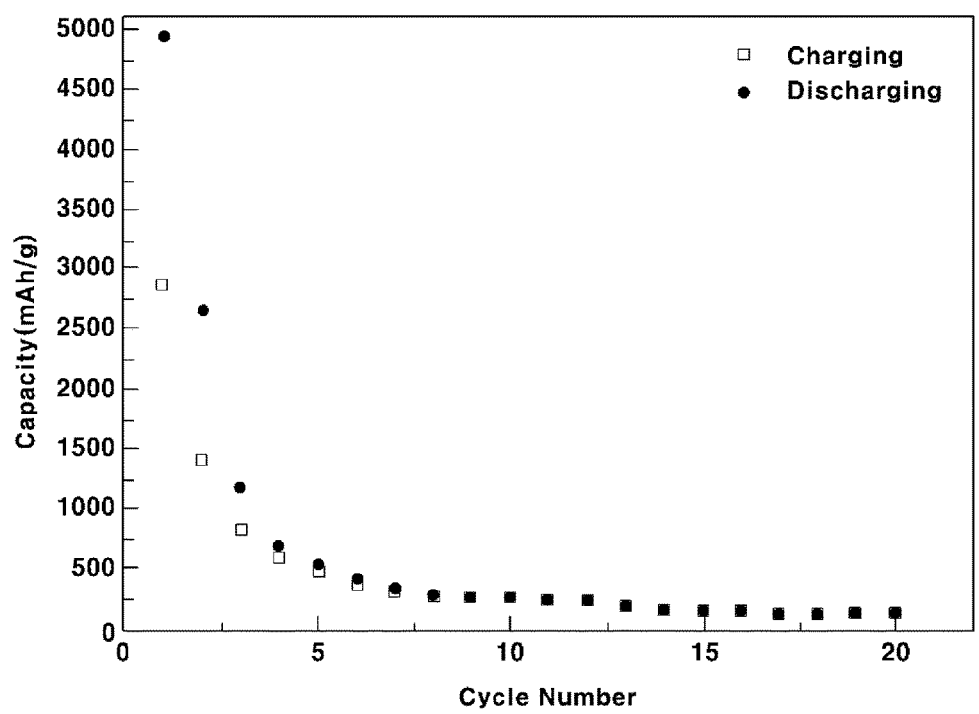
FIG. 6 is a graph illustrating a change in charging-discharging cycle capacity for the conventional anode manufactured by a method according to comparative example.

For comparison, the charging-discharging cycle capacity of the electrode manufactured by a conventional method is illustrated in FIG. 6. The conventional electrode is a negative electrode including a silicon powder having a size of about 100 nm size, in an amount of about 60 wt %, a binder, for instance PVDF of about 20 wt %, and carbon black of about 20 wt %. The capacity measured from the exemplary conventional anode rapidly decreases without withstanding the volume expansion occurring after a first cycle.

Various modifications of the exemplary embodiments will be obvious to the person with ordinary skill in the art of the present invention, and general principles defined herein may be applied to other exemplary embodiments without departing from the scope of the present invention. Therefore, the present invention is not limited to the exemplary embodiment suggested herein, and is to be interpreted in the broadest scope, which is consistent with the principles and novel features suggested herein.

The present invention provides a technology which may be applied to an anode of a lithium secondary battery, and may be applied to improve the structure of Si nanowires of the anode.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A silicon (Si) nanowire structure embedded in nickel silicide ($NiSi_x$) nanowires comprising:
   a substrate;
   a nickel (Ni) thin film deposited on the substrate;
   Si nanowires randomly distributed on the nickel (Ni) thin film; and
   $NiSi_x$ nanowires embedding the Si nanowires while being deposited on the Ni thin film,
   wherein the $NiSi_x$ nanowires provide elastic contact with respect to the Si nanowire, and have a structure which withstands the volume expansion of the Si nanowires,
   wherein the $NiSi_x$ nanowires are grown on the Si nanowires disposed on the Ni thin film,
   wherein the Si nanowires and $NiSi_x$ nanowires are solid,
   wherein the $NiSi_x$ nanowires cover at least a portion of the outside of the Si nanowire, and
   wherein the substrate is a current collector of an anode.

2. The Si nanowire structure embedded in $NiSi_x$ nanowires of claim 1, wherein the substrate is a copper (Cu) substrate or a steel-use-stainless (SUS) substrate.

3. An anode comprising the Si nanowire structure embedded in $NiSi_x$ nanowires of claim 1.

4. A lithium secondary battery comprising an anode comprising the Si nanowire structure embedded in $NiSi_x$ nanowires of claim 1.

5. The lithium secondary battery of claim 4, wherein the battery is used for a vehicle.

* * * * *